United States Patent
Harada et al.

(10) Patent No.: US 8,525,187 B2
(45) Date of Patent: Sep. 3, 2013

(54) INSULATED GATE BIPOLAR TRANSISTOR

(75) Inventors: Shin Harada, Osaka (JP); Keiji Wada, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 220 days.

(21) Appl. No.: 13/122,353

(22) PCT Filed: Mar. 23, 2010

(86) PCT No.: PCT/JP2010/054950
§ 371 (c)(1),
(2), (4) Date: Apr. 1, 2011

(87) PCT Pub. No.: WO2010/116886
PCT Pub. Date: Oct. 14, 2010

(65) Prior Publication Data
US 2011/0180813 A1 Jul. 28, 2011

(30) Foreign Application Priority Data
Apr. 10, 2009 (JP) .................................. 2009-095481

(51) Int. Cl.
*H01L 29/15* (2006.01)
(52) U.S. Cl.
USPC ............. 257/77; 257/173; 257/362; 257/410; 257/586; 257/592; 257/E29.104; 257/E29.197; 257/E29.2
(58) Field of Classification Search
USPC ................... 257/77, 173, 362, 410, 586, 592, 257/E29.104, E29.197, E29.2
See application file for complete search history.

(56) References Cited

U.S. PATENT DOCUMENTS
6,734,461 B1  5/2004  Shiomi et al.
7,671,409 B2  3/2010  Kitabatake et al.
(Continued)

FOREIGN PATENT DOCUMENTS
CN    1802752 A    7/2006
EP    1 215 730 B9   8/2007
(Continued)

OTHER PUBLICATIONS
Zhang, Q. et al. "9 kV 4H-SiC IGBTs with 88 mΩ-cm$^2$ of $R_{diff, on}$", Materials Science Forum, vols. 556-557, pp. 771-774 (2007).
(Continued)

*Primary Examiner* — Tu-Tu Ho
(74) *Attorney, Agent, or Firm* — Venable LLP; Michael A. Sartori; Tamatane J. Aga

(57) ABSTRACT

An IGBT, which is capable of reducing on resistance by reducing channel mobility, includes: an n type substrate made of SiC and having a main surface with an off angle of not less than 50° and not more than 65° relative to a plane orientation of {0001}; a p type reverse breakdown voltage holding layer made of SiC and formed on the main surface of the substrate; an n type well region formed to include a second main surface of the reverse breakdown voltage holding layer; an emitter region formed in the well region to include the second main surface and including a p type impurity at a concentration higher than that of the reverse breakdown voltage holding layer; a gate oxide film formed on the reverse breakdown voltage holding layer; and a gate electrode formed on the gate oxide film. In a region including an interface between the well region and the gate oxide film, a high-concentration nitrogen region is formed to have a nitrogen concentration higher than those of the well region and the gate oxide film.

5 Claims, 6 Drawing Sheets

(56) References Cited

U.S. PATENT DOCUMENTS

| | | |
|---|---|---|
| 2006/0220026 A1 | 10/2006 | Uchida et al. |
| 2007/0045631 A1 | 3/2007 | Endo et al. |
| 2007/0176230 A1 | 8/2007 | Uchida et al. |
| 2008/0001158 A1* | 1/2008 | Das et al. .................. 257/77 |
| 2008/0265260 A1 | 10/2008 | Kitabatake et al. |

FOREIGN PATENT DOCUMENTS

| | | |
|---|---|---|
| JP | 2000-188399 A | 7/2000 |
| JP | 2001-144288 A | 5/2001 |
| JP | 2002-261041 A | 9/2002 |
| JP | 2002-261275 A | 9/2002 |
| JP | 2005166930 A | 6/2005 |
| JP | 2005-183943 A | 7/2005 |
| JP | 3854508 B2 | 12/2006 |
| JP | 4064436 B2 | 3/2008 |

OTHER PUBLICATIONS

V.K. Khanna, "IGBT Theory and Design," IEEE, USA, pp. 38-45, Dec. 31, 2003.

Office Action in Chinese Patent Application No. 201080002822.3 dated Jan. 7, 2013.

\* cited by examiner

INSULATED GATE BIPOLAR TRANSISTOR

TECHNICAL FIELD

The present invention relates to an insulated gate bipolar transistor, more particularly, an insulated gate bipolar transistor capable of improving channel mobility.

BACKGROUND ART

In recent years, in order to achieve high reverse breakdown voltage and low loss in semiconductor devices as well as utilization thereof in a high temperature environment, silicon carbide (SiC) has begun to be adopted as a material for the semiconductor devices. Silicon carbide is a wide band gap semiconductor having a larger band gap than that of silicon (Si), which has been widely used as a material for semiconductor devices conventionally. Hence, the adoption of silicon carbide as the material for semiconductor devices will achieve high reverse breakdown voltage, reduced on resistance, and the like in the semiconductor devices. Further, when such semiconductor devices formed using silicon carbide as their material are utilized in a high temperature environment, the semiconductor devices are less deteriorated in properties as compared with semiconductor devices formed using silicon as their material, advantageously.

For example, it is reported that when SiC is adopted as a material for an insulated gate bipolar transistor (IGBT), which is a semiconductor device, a reverse breakdown voltage of 9 kV and an on resistance of 88 m$\Omega$cm$^2$ under a gate voltage of 20 V are attained (see Qingchun Zhang et al., "9 kV 4H—SiC IGBTs with 88 m$\Omega$cm$^2$ of R$_{diff,on}$", Materials Science Forum, 2007, Vols. 556-557, p. 771-774 (Non-Patent Document 1)).

PRIOR ART DOCUMENTS

Non-Patent Documents

Non-Patent Document 1: Qingchun Zhang et al., "9 kV 4H—SiC IGBTs with 88 m$\Omega$cm$^2$ of R$_{diff,on}$", Materials Science Forum, 2007, Vols. 556-557, p. 771-774

SUMMARY OF THE INVENTION

Problems to be Solved by the Invention

However, requirements for properties of IGBTs are still increasing in recent years. In consideration of the requirements, it cannot be said that conventional IGBTs, including the IGBT disclosed in the above-described Non-Patent Document 1, have a sufficiently high channel mobility. Accordingly, it cannot be said that on resistance therein is sufficiently reduced.

In view of the foregoing problem, an object of the present invention is to provide an IGBT reducing on resistance by improving channel mobility.

Means for Solving the Problems

An insulated gate bipolar transistor (IGBT) according to the present invention includes a substrate, a reverse breakdown voltage holding layer, a well region, an emitter region, an oxide film, and an electrode. The substrate is made of silicon carbide, has a main surface with an off angle of not less than 50° and not more than 65° relative to a plane orientation of {0001}, and is of the first conductive type. The reverse breakdown voltage holding layer is made of silicon carbide, is formed on the main surface of the substrate, and is of second conductive type different from the first conductive type. The well region is formed in the reverse breakdown voltage holding layer so as to include a second main surface thereof, the second main surface being a main surface opposite to a first main surface thereof adjacent to the substrate. The well region is of the first conductive type. The emitter region is formed in the well region to include the second main surface, and is of the second conductive type by including an impurity of the second conductive type at a concentration higher than that of the reverse breakdown voltage holding layer. The oxide film is made of oxide, and is formed on the reverse breakdown voltage holding layer in contact with the second main surface. The electrode is formed on the oxide film. In a region including an interface between the well region and the oxide film, a high-concentration nitrogen region is formed to have a nitrogen concentration higher than those of the well region and the oxide film.

The present inventor has closely studied a method to improve channel mobility of an IGBT. As a result, the present inventor has found the following and arrived at the present invention.

Specifically, a SiC substrate employed in an IGBT adopting SiC as its material generally has a main surface with an off angle of approximately 8° relative to the plane orientation of {0001}. On the main surface, a reverse breakdown voltage holding layer, an emitter region, an oxide film, an electrode, and the like are formed to obtain the IGBT. However, in the IGBT having such a structure, because the substrate has the main surface with the off angle of approximately 8° relative to the plane orientation of {0001}, a multiplicity of interface states are formed in the vicinity of an interface of the well region, which serves as a channel, with the oxide film. This prevents traveling of electrons. Accordingly, the channel mobility is decreased.

To address this, the IGBT of the present invention employs the SiC substrate having the main surface with the off angle of not less than 50° and not more than 65° relative to the plane orientation of {0001}, thereby reducing formation of the interface states to improve channel mobility.

Further, it has been found that the high-concentration nitrogen region formed in the region including the interface between the well region and the oxide film results in improved channel mobility. Accordingly, in the IGBT of the present invention, the channel mobility is further improved.

As described above, according to the IGBT of the present invention, there can be provided an IGBT reducing the on resistance by improving the channel mobility.

Here, the lower limit of the off angle is set at 50° based on the following facts: as a result of inspecting a relation between the off angle and the channel mobility, it was observed that as the off angle is increased in the course of a (01-14) plane in which the off angle is 43.3° to a (01-13) plane in which the off angle is 51.5°, the channel mobility is significantly increased; and there is no natural plane in the range of the off angle between the (01-14) plane and the (01-13) plane. Further, the upper limit of the off angle is set at 65° based on the following facts: it was observed that the carrier mobility is significantly decreased as the off angle is increased in the course of a (01-12) plane in which the off angle is 62.1° to a (01-10) plane in which the off angle is 90°; and there is no natural plane in the range of the off angle between the (01-12) plane and the (01-10) plane.

In the above-described IGBT, the nitrogen concentration in a region distant away by 10 nm or shorter from the interface between the well region and the oxide film has a maximum value of not less than $1\times10^{21}$ cm$^{-3}$.

As a result of review by the present inventor, important in improving the channel mobility is the maximum value of the nitrogen concentration in the region distant away from 10 nm or shorter from the interface between the well region and the oxide film. By setting the maximum value of the nitrogen concentration in the region at $1\times10^{21}$ cm$^{-3}$ or greater, it was found that the channel mobility is significantly improved. Hence, with the above-described configuration, the channel mobility can be further improved.

In the IGBT, the main surface of the substrate may have an off orientation falling within a range of ±5° or smaller relative to a <11-20> direction.

The <11-20> direction is a representative off orientation in the SiC substrate. Variation of the off orientation, which is caused by variation, etc., in the slicing process in the step of manufacturing the substrate, is set to be ±5°, thereby facilitating formation of an epitaxial layer on the SiC substrate, and the like. In this way, the IGBT can be manufactured readily.

In the IGBT, the main surface of the substrate may have an off orientation falling within a range of ±5° relative to the <01-10> direction.

As with the <11-20> direction described above, the <01-10> direction is a representative off orientation in the SiC substrate. Variation of the off orientation, which is caused by variation, etc., in the slicing process in the step of manufacturing the substrate, is set to be ±5°, thereby facilitating formation of an epitaxial layer on the SiC substrate, and the like. In this way, the IGBT can be manufactured readily.

In the IGBT, the main surface of the substrate can have an off angle of not less than −3° and not more than +5° relative to a plane orientation of {03-38}.

In this way, the channel mobility can be further improved. Here, the off angle is thus set at not less than −3° and not more than +5° relative to the plane orientation of {03-38} because particularly high channel mobility was obtained in this range as a result of inspecting the relation between the channel mobility and the off angle.

Here, the state in which "the off angle is not less than −3° and not more than +5° relative to the plane orientation of {03-38}" refers to a state in which the orthogonal projection of a normal line of the main surface to a flat plane defined by the <0001> direction and the <01-10> direction serving as a reference for the off orientation forms an angle of not less than −3° and not more than +5° relative to a normal line of the {03-38} plane. The sign of a positive value corresponds to a case where the orthogonal projection approaches in parallel with the <01-10> direction whereas the sign of a negative value corresponds to a case where the orthogonal projection approaches in parallel with the <0001> direction.

It should be noted that the plane orientation of the main surface thereof is more preferably substantially {03-38} and the plane orientation of the main surface thereof is further preferably {03-38}. Here, the expression "the plane orientation of the main surface is substantially {03-38}" indicates that the plane orientation of the main surface of the substrate is included in a range of the off angle in which the plane orientation of the substrate can be regarded as substantially {03-38} in consideration of precision of processing the substrate and the like. The range of the off angle in this case is a range in which the off angle is ±2° relative to {03-38}, for example. In this way, the above-described channel mobility can be improved further.

In the IGBT, the main surface of the substrate may have an off angle of not less than −3° and not more than +5° relative to a (0-33-8) plane in the <01-10> direction.

In particular, a structure is employed in which semiconductor layers and an insulating film are formed on a surface close to the (0-33-8) plane, which is a plane close to the C (carbon) plane in the {03-38} plane. In this way, the carrier mobility is improved significantly.

Here, in the present application, the (0001) plane of single-crystal silicon carbide of hexagonal crystal is defined as the silicon plane whereas the (000-1) plane is defined as the carbon plane. Meanwhile, the "off angle relative to the (0-33-8) plane in the <01-10> direction" refers to an angle formed by the orthogonal projection of a normal line of the main surface to a flat plane defined by the <000-1> direction and the <01-10> direction serving as a reference for the off orientation, and a normal line of the (0-33-8) plane. The sign of a positive value corresponds to a case where the orthogonal projection approaches in parallel with the <01-10> direction, whereas the sign of a negative value corresponds to a case where the orthogonal projection approaches in parallel with the <000-1> direction. Further, the expression "the main surface having an off angle of not less than −3° and not more than +5° relative to the (0-33-8) plane in the <01-10> direction" indicates that the main surface corresponds to a plane, at the carbon plane side, which satisfies the above-described conditions in the silicon carbide crystal. It should be noted that in the present application, the (0-33-8) plane includes an equivalent plane, at the carbon plane side, which is expressed in a different manner due to determination of an axis for defining a crystal plane, and does not include a plane at the silicon plane side.

Effects of the Invention

As apparent from the description above, according to the IGBT of the present invention, there can be provided an IGBT reducing on resistance by improving channel mobility.

MODES FOR CARRYING OUT THE INVENTION

Figure 1:
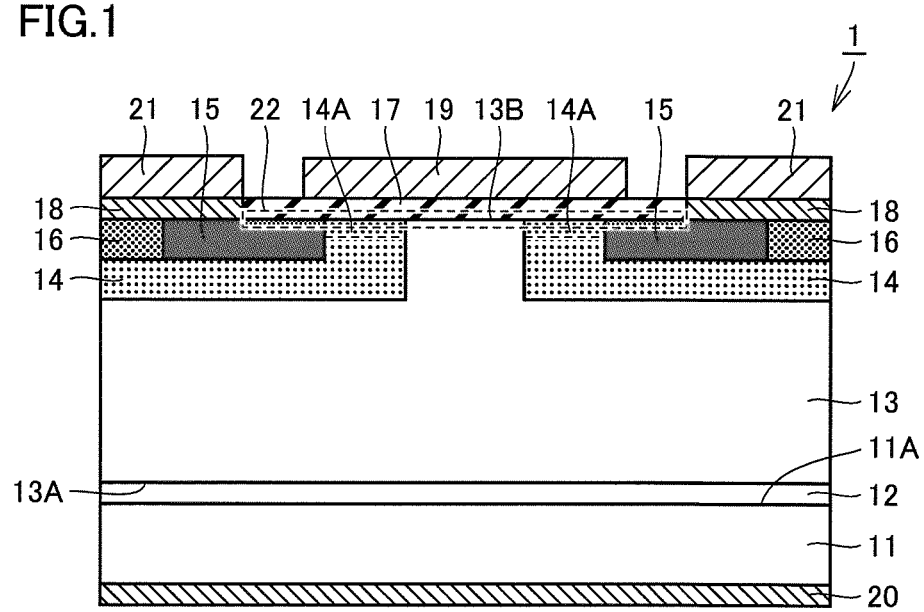
FIG. 1 is a schematic cross sectional view showing a structure of an IGBT.

The following describes an embodiment of the present invention with reference to figures. It should be noted that in the below-mentioned figures, the same or corresponding portions are given the same reference characters and are not described repeatedly.

First, a structure of an IGBT in one embodiment of the present invention will be described. Referring to FIG. 1, IGBT 1 in the present embodiment includes a substrate 11, a buffer layer 12, a reverse breakdown voltage holding layer 13, well regions 14, emitter regions 15, and contact regions 16.

Substrate 11 is formed of hexagonal SiC, such as 4H—SiC, and has a main surface 11A having an off angle of not less than 50° and not more than 65° relative to a plane orientation of {0001}, for example, having a plane orientation of (03-38). In addition, substrate 11 includes an n type impurity, thus having n type (first conductive type) conductivity. Further, substrate 11 has a resistivity of approximately 0.02 Ωcm, for example.

Buffer layer 12 is a SiC layer formed on main surface 11A of substrate 11 through epitaxial growth. Buffer layer 12 has a thickness of approximately 0.5 μm. Buffer layer 12 contains a p type impurity at a concentration of approximately $5 \times 10^{17}$ $cm^{-3}$, and therefore has p type (second conductive type) conductivity.

Reverse breakdown voltage holding layer 13 is formed of SiC, and is formed above main surface 11A of substrate 11 with buffer layer 12 interposed therebetween. Reverse breakdown voltage holding layer 13 includes a p type impurity at a concentration of approximately $4 \times 10^{14}$ $cm^{-3}$, and therefore has p type conductivity. Further, reverse breakdown voltage holding layer 13 has a thickness of, for example, approximately 120 μm.

Well regions 14 are formed in reverse breakdown voltage holding layer 13 so as to include a second main surface 13B thereof opposite to its first main surface 13A, which is a main surface adjacent to substrate 11. Each of well regions 14 includes an n type impurity and therefore has n type conductivity.

Emitter regions 15 are formed in well regions 14 so as to include second main surface 13B. Each of emitter regions 15 includes a p type impurity having a concentration higher than that in reverse breakdown voltage holding layer 13, and therefore has p type conductivity.

Contact regions 16 are disposed in well regions 14 so as to include second main surface 13B and are positioned adjacent to emitter regions 15. Each of contact regions 16 includes an n type impurity having a concentration higher than those of other regions in well regions 14, and therefore has n type conductivity.

Further, IGBT 1 in the present embodiment includes a gate oxide film 17, a gate electrode 19, ohmic contact electrodes 18, emitter electrodes 21, and a collector electrode 20.

Gate oxide film 17 is formed on reverse breakdown voltage holding layer 13 in contact with second main surface 13B, and is formed of oxide, specifically, silicon dioxide ($SiO_2$) with a thickness of 40 nm, for example. Further, gate electrode 19 is disposed on and in contact with gate oxide film 17. Gate electrode 19 is formed to extend from each of regions above emitter regions 15 toward a side opposite to each of contact regions 16 when viewed from each of emitter regions 15, so as to reach a region not provided with well regions 14 above reverse breakdown voltage holding layer 13. Gate electrode 19 is formed of, for example, a conductor such as Al (aluminum) or polysilicon.

Each of ohmic contact electrodes 18 is disposed on second main surface 13B so as to extend from a region in which it makes contact with a corresponding emitter region 15 to a region in which it makes contact with a corresponding contact region 16. Further, ohmic contact electrode 18 is formed of a conductor at least partially silicided to secure ohmic contact with emitter regions 15, such as Ni (nickel).

Emitter electrodes 21 are disposed on and in contact with ohmic contact electrodes 18, and are formed of a conductor such as Al. Further, collector electrode 20 is formed on an opposite main surface of substrate 11 to the main surface thereof on which reverse breakdown voltage holding layer 13 is formed. Collector electrode 20 is formed of a conductor at least partially silicided to secure ohmic contact with substrate 11, such as Ni (nickel).

Further, in a region including an interface between each of well regions 14 and gate oxide film 17, there is formed a high-concentration nitrogen region 22 having a nitrogen concentration higher than those in well regions 14 and gate oxide film 17.

The following describes operations of IGBT 1 in the present embodiment. Referring to FIG. 1, when a negative voltage exceeding a threshold value is applied to gate electrode 19, an inversion layer is formed in each of channel regions 14A of well regions 14, thereby electrically connecting emitter regions 15 and reverse breakdown voltage holding layer 13 to one another. Channel regions 14A are in contact with gate oxide film 17 below gate electrode 19. Accordingly, positive holes are introduced from emitter regions 15 to reverse breakdown voltage holding layer 13, thereby supplying electrons from substrate 11 to reverse breakdown voltage holding layer 13 via buffer layer 12. This brings IGBT 1 into an on state, which causes conductivity modulation in reverse breakdown voltage holding layer 13. This allows a current to flow under decreased resistance between each of emitter electrodes 21 and collector electrode 20. Meanwhile, when the negative voltage applied to gate electrode 19 becomes equal to or smaller than the threshold value, no inversion layer is formed in each of channel regions 14A. Accordingly, a reverse bias state is maintained between reverse breakdown voltage holding layer 13 and each of well regions 14. This brings IGBT 1 into an off state, and no current flows accordingly.

Here, IGBT 1 in the present embodiment employs substrate 11 having main surface 11A with an off angle of not less than 50° and not more than 65° relative to the plane orientation of {0001}. Further, buffer layer 12 and reverse breakdown voltage holding layer 13 (including the regions provided with well regions 14) are formed on and above main surface 11A through epitaxial growth. Hence, interface states are less formed in the vicinity of the interface with gate oxide film 17, thereby improving channel mobility. It should be noted that by setting the plane orientation of main surface 11A to (0-33-8), the channel mobility can be improved more.

Further, high-concentration nitrogen region 22 formed in the region including the interface between each of channel regions 14A and gate oxide film 17 further improves the channel mobility. This is considered to be attained due to the following reasons. That is, in the case where gate oxide film 17 is formed by means of thermal oxidation or the like, a multiplicity of interface states are formed in the interface between gate oxide film 17 and each of channel regions 14A made of semiconductor. If nothing is done, the channel mobility in each of channel regions 14A will be drastically decreased as compared with a theoretical value. To address this, nitrogen is introduced into the region including the interface between gate oxide film 17 and each of channel regions 14A as described above, so as to reduce the influence of the interface states.

As described above, IGBT 1 in the present embodiment is an IGBT in which the channel mobility is improved to reduce the on resistance.

Here, in IGBT 1 in the present embodiment, it is desirable that the maximum value of the nitrogen concentration is not less than $1×10^{21}$ cm$^{-3}$ in a region distant away by 10 nm or shorter from the interface between each of well regions 14 (channel regions 14A) and gate oxide film 17. In this way, the channel mobility can be further improved.

It should be noted that in the embodiment, there may be employed a substrate having a main surface with an off orientation falling within a range of ±5° or smaller relative to the <11-20> direction, instead of substrate 11 having the main surface with the plane orientation of (03-38). This facilitates formation of an epitaxial layer on the SiC substrate, thus facilitating manufacturing of the IGBT.

In the embodiment, main surface 11A of substrate 11 may have an off orientation falling within a range of ±5° or smaller relative to the <01-10> direction. This facilitates formation of an epitaxial layer on the SiC substrate, thus facilitating manufacturing of the IGBT. Further, the channel mobility can be improved more by setting the plane orientation of main surface 11A of substrate 11 such that the off angle is not less than −3° and not more than +5° relative to the plane orientation of {03-38}. Furthermore, it is most preferable that the plane orientation of main surface 11A of substrate 11 be the plane orientation of {03-38}.

Figure 2:
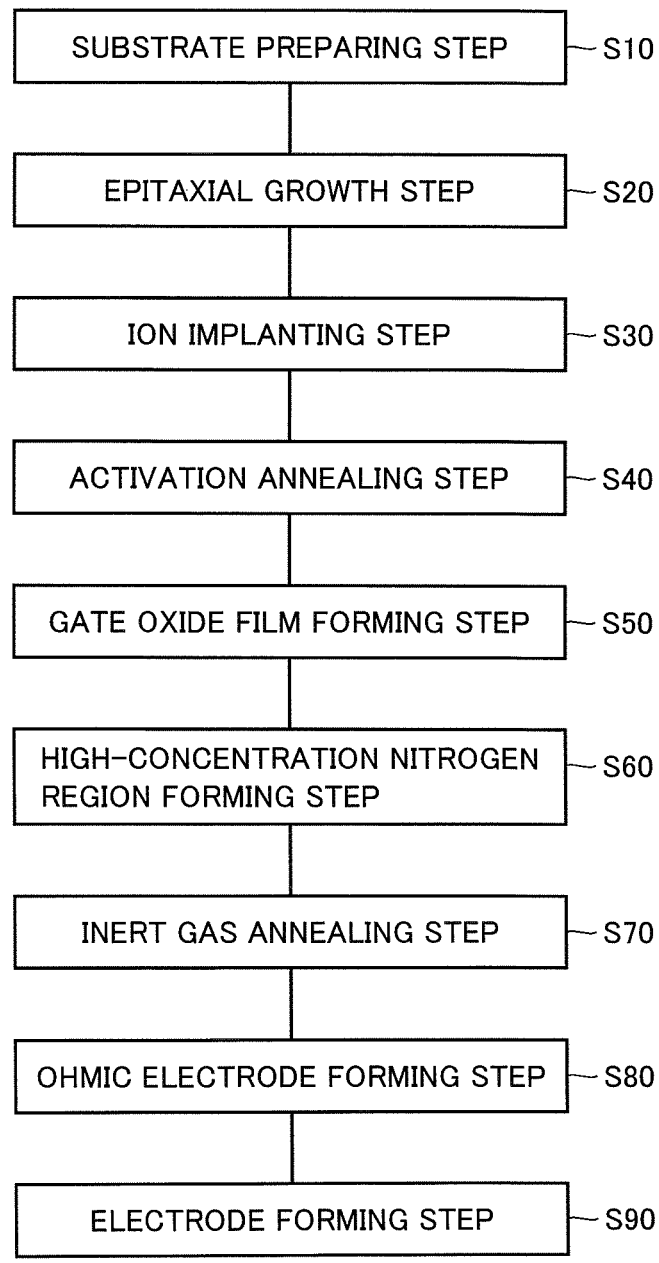
FIG. 2 is a flowchart schematically showing a method for manufacturing the IGBT.
Figure 3:
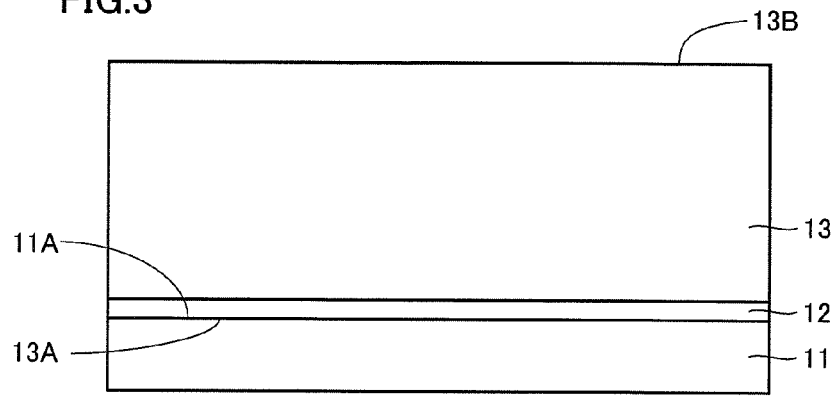
FIG. 3 is a schematic cross sectional view for illustrating the method for manufacturing the IGBT.
Figure 4:
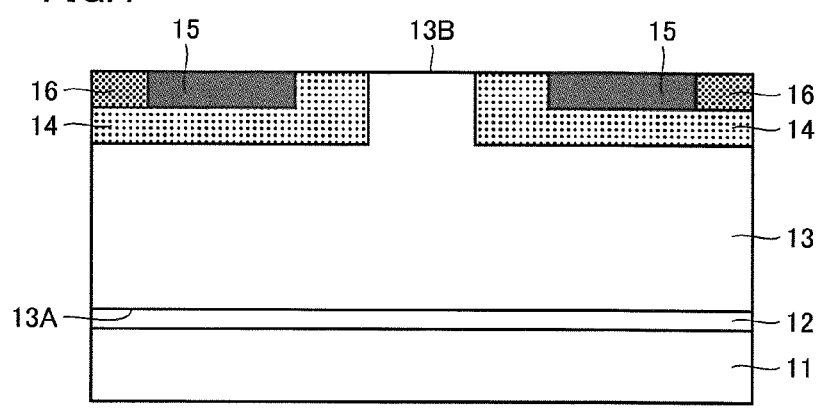
FIG. 4 is a schematic cross sectional view for illustrating the method for manufacturing the IGBT.
Figure 5:
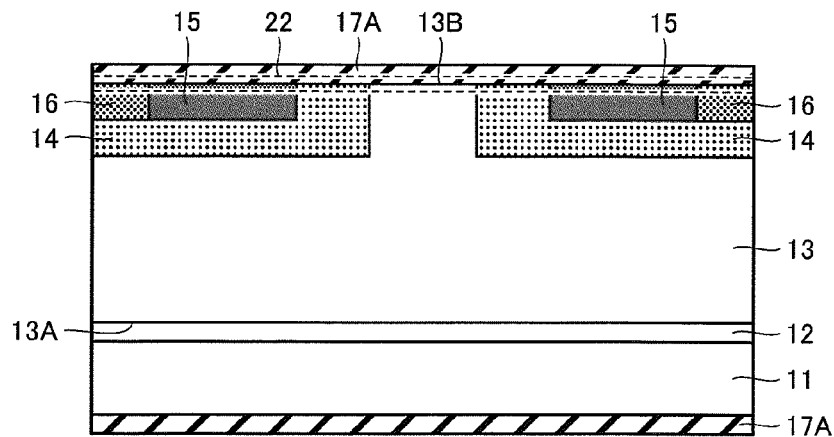
FIG. 5 is a schematic cross sectional view for illustrating the method for manufacturing the IGBT.
Figure 6:
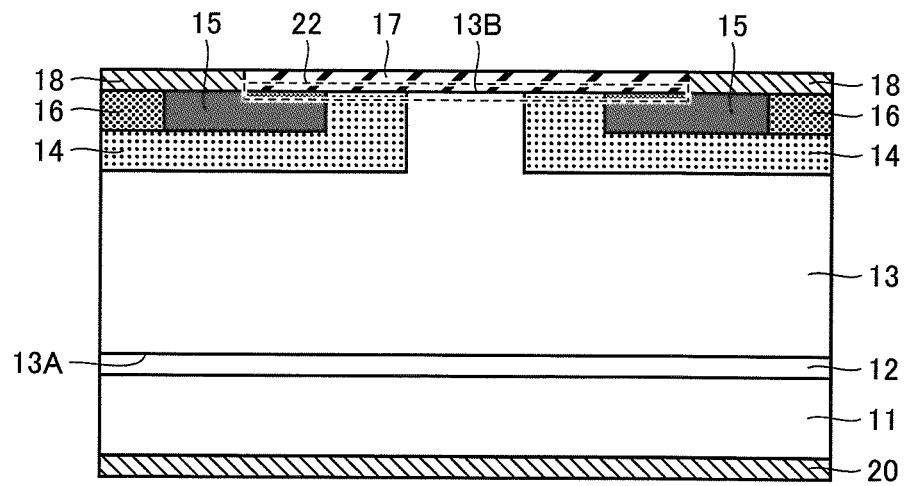
FIG. 6 is a schematic cross sectional view for illustrating the method for manufacturing the IGBT.

The following describes a method for manufacturing IGBT 1 in the present embodiment, with reference to FIGS. 2-6. Referring to FIG. 2, a substrate preparing step is performed first as step (S10) in the method for manufacturing IGBT 1 in the present embodiment. In step (S10), referring to FIG. 3, substrate 11 is prepared. Substrate 11 is formed of, for example, 4H—SiC. Substrate 11 has main surface 11A having an off angle of not less than 50° and not more than 65° relative to the plane orientation of {0001}, for example, having the plane orientation of (03-38). Substrate 11 includes the n type impurity and therefore has n type conductivity. For further improvement of the channel mobility in IGBT 1 to be manufactured, there may be prepared a substrate 11 having a main surface 11A with a plane orientation of (0-33-8).

Next, referring to FIG. 2, an epitaxial growth step is performed as step (S20). In this step (S20), referring to FIG. 3, buffer layer 12 and reverse breakdown voltage holding layer 13 are formed, by means of epitaxial growth, on main surface 11A of substrate 11 prepared in step (S10). The epitaxial growth can be implemented by employing, for example, a mixed gas of SiH$_4$ (silane) and C$_3$H$_8$ (propane) as a raw material gas. On this occasion, first, a SiC layer having a p type impurity introduced at a concentration of approximately $5×10^{17}$ cm$^{-3}$ is formed to have a thickness of approximately 0.5 μm, thereby obtaining buffer layer 12. Then, the concentration of the p type impurity is changed to approximately $4×10^{14}$ cm$^{-3}$ to form a SiC layer having a thickness of approximately 120 μm, thereby obtaining reverse breakdown voltage holding layer 13.

Next, referring to FIG. 2, an ion implanting step is performed as step (S30). In this step (S30), referring to FIGS. 3 and 4, well regions 14, emitter regions 15, and contact regions 16 are formed sequentially by means of ion implantation in the region including second main surface 13B of reverse breakdown voltage holding layer 13 having been formed in step (S20), i.e., the main surface thereof opposite to its first main surface 13A adjacent to substrate 11.

Specifically, first, on second main surface 13B, an oxide film made of SiO$_2$ is formed by means of, for example, CVD. Then, a resist is applied to the oxide film, which is then exposed to light and developed, thereby forming a resist film having openings in regions corresponding to desired shapes of well regions 14. Then, using the resist film as a mask, the oxide film is partially removed by means of, for example, RIE (Reactive Ion Etching), thereby forming a mask layer constituted by the oxide film having an opening pattern corresponding to the desired shapes of well regions 14. Thereafter, the resist film is removed, and then the n type impurity is ion-implanted using the mask layer as a mask, thus forming well regions 14.

Thereafter, the mask layer is removed and then a mask layer having an opening pattern corresponding to desired shapes of emitter regions 15 is formed and then the p type impurity is ion-implanted to form emitter regions 15, in a similar procedure. Then, the mask layer is removed and then a mask layer having an opening pattern corresponding to desired shapes of contact regions 16 is formed and then the n type impurity is ion-implanted to form contact regions 16, in a similar procedure.

Then, referring to FIG. 2, an activation annealing step is performed as step (S40). In this step (S40), referring to FIG. 4, reverse breakdown voltage holding layer 13 having been through the ion implantation in step (S30) is heated to perform activation annealing, which is heat treatment for activating the impurity introduced by the ion implantation. The activation annealing is performed by, for example, performing heat treatment in an argon gas atmosphere while keeping a temperature at 1700° C. for 30 minutes.

Next, referring to FIG. 2, a gate oxide film forming step is performed as step (S50). In this step (S50), referring to FIGS. 4 and 5, substrate 11 on which reverse breakdown voltage holding layer 13 including the desired ion-implanted layers are formed as a result of steps (S10)-(S40) is heated at 1200° C. in an oxidizing atmosphere for 30 minutes for dry oxidation. In this way, a thermal oxidation film 17A to serve as gate oxide film 17 (see FIG. 1) is formed on second main surface 13B. Thermal oxidation film 17A has a thickness of, for example, approximately 40 nm.

Next, referring to FIG. 2, a high-concentration nitrogen region forming step is performed as step (S60). In this step (S60), referring to FIG. 5, heat treatment is performed to heat in, for example, a nitrogen monoxide (NO) gas atmosphere while keeping a temperature at 1200° C. for 120 minutes. In this way, in a region including an interface between thermal oxidation film 17A and each of reverse breakdown voltage holding layer 13, well regions 14, emitter regions 15, and contact regions 16, there is formed high-concentration nitrogen region 22 having a higher nitrogen concentration than those in the adjacent regions.

Next, referring to FIG. 2, an inert gas annealing step is performed as step (S70). In this step (S70), heat treatment is performed to heat in an inert gas atmosphere such as Ar (argon) while keeping a temperature at 1200° C. for 60 minutes.

Then, as step (S80), an ohmic electrode forming step is performed. In this step (S80), referring to FIGS. 5 and 6, first, a photolithography method is employed to form, on thermal oxidation film 17A formed on second main surface 13B, a resist film having openings corresponding to desired shapes of ohmic contact electrodes 18. Next, the resist film is used as a mask in removing thermal oxidation film 17A exposed from the openings and thermal oxidation film 17A formed on the opposite main surface of substrate 11 to the main surface thereof on which reverse breakdown voltage holding layer 13 is formed. Further, for example, by means of a vapor deposition method, a nickel (Ni) film is formed on each of second main surface 13B and the opposite main surface of substrate 11 to reverse breakdown voltage holding layer 13. Then, the resist film is removed together with the Ni film existing on the resist film (lifted off), thereby forming the Ni film in each of the regions in which ohmic contact electrodes 18 and collector electrode 20 should be formed. Thereafter, for example, heat treatment is performed to heat in an Ar atmosphere while keeping a temperature at 950° C. for 2 minutes, which results in silicidation of at least a portion of the Ni film. In this way, ohmic contact electrodes 18 and collector electrode 20 are completed. It should be noted that thermal oxidation film 17A remaining on second main surface 13B on this occasion will serve as gate oxide film 17.

Then, referring to FIG. 2, an electrode forming step is performed as step (S90). In this step (S90), referring to FIGS. 6 and 1, gate electrode 19 made of a conductor such as Al or polysilicon is formed on gate oxide film 17, and emitter electrodes 21 each made of Al, which is a conductor, are formed on ohmic contact electrodes 18. With the above-described steps, IGBT 1 in the present embodiment is completed.

EXAMPLES

Example 1

The following describes an Example 1 of the present invention. An experiment was conducted to confirm the improvement of the channel mobility and the reduction of the on resistance in the IGBT of the present invention. The experiment was conducted in the following procedure.

First, an experiment method will be described. An IGBT was actually fabricated using the manufacturing method described in the above-described embodiment and the on resistance thereof was measured. Specifically, referring to FIGS. 1-6, first, substrate 11 (n type; resistivity of 0.02 Ωcm) was prepared which was formed of 4H—SiC and had main surface 11A with the plane orientation of (03-38). On the substrate, buffer layer 12 (p type; impurity concentration of $5 \times 10^{17}$ cm$^{-3}$; thickness of 0.5 μm) and reverse breakdown voltage holding layer 13 (p type; impurity concentration of $4 \times 10^{14}$ cm$^{-3}$; thickness of 120 μm) were epitaxially grown. Thereafter, well regions 14, emitter regions 15, and contact regions 16 were formed through ion implantation, and then activation annealing was implemented in an Ar atmosphere while keeping a temperature at 1700° C. for 30 minutes. Further, dry oxidation was implemented in an oxidizing atmosphere while keeping a temperature at 1200° C. for 30 minutes, thereby forming thermal oxidation film 17A having a thickness of 40 nm and to serve as gate oxide film 17. Thereafter, high-concentration nitrogen region 22 was formed in a NO gas atmosphere while keeping a temperature at 1200° C. for 120 minutes. Then, in an Ar gas atmosphere, heat treatment was performed while keeping a temperature at 1200° C. for 60 minutes, and thereafter, ohmic contact electrodes 18, collector electrode 20, gate electrode 19, and emitter electrodes 21 were formed, thus completing IGBT 1 (example). Here, a cell pitch was set at 20 μm and a channel length was set at 2 μm. The cell pitch refers to the width of substrate 11 in a direction along main surface 11A in FIG. 1. The channel length refers to the width of each of channel regions 14A along second surface 13B in FIG. 1.

Meanwhile, for the purpose of comparison, a substrate 11 (n type; resistivity of 0.02 Ωcm) was prepared which was formed of 4H—SiC and had a main surface 11A having an off angle of 8° relative to the plane orientation of (0001). Under the same conditions as those in the above-described fabrication method, another IGBT 1 was fabricated (comparative example).

Then, the IGBTs of the example and the comparative example were actually operated and respective on resistances were measured.

Figure 7:
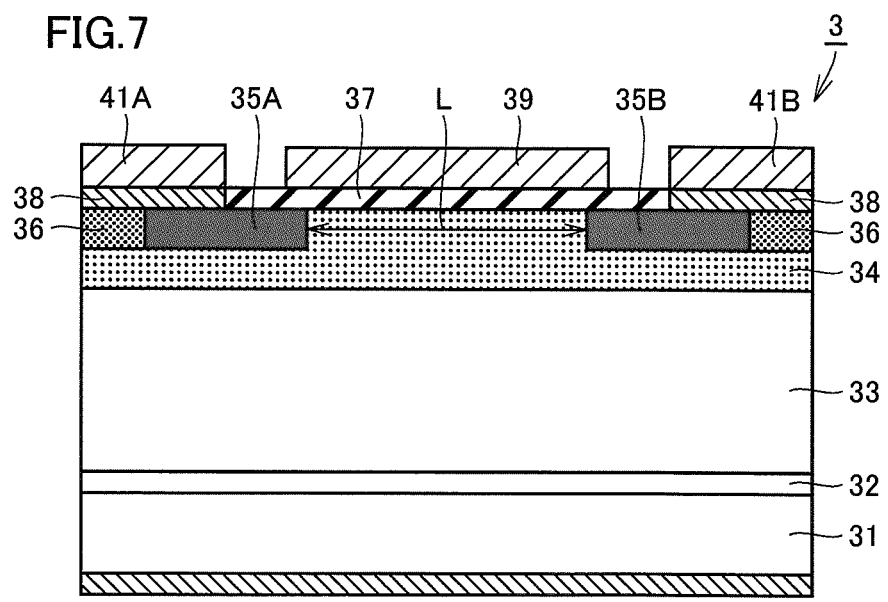
FIG. 7 is a schematic cross sectional view showing a structure of a TEG-MOSFET.

Meanwhile, TEG (Test Element Group)-MOSFETs thereof were fabricated for measurement of channel mobilities. Specifically, referring to FIG. 7, substrates 31 were prepared which were similar to those of the example and the comparative example for the measurement of on resistance. With them, TEG-MOSFETs 3 were fabricated to have the same impurity concentrations, thicknesses, and the like therein as the foregoing IGBTs, at the same time as the fabrication of the foregoing IGBTs. Namely, a buffer layer 32 corresponding to buffer layer 12 and a p type layer 33 corresponding to reverse breakdown voltage holding layer 13 were epitaxially grown on each of substrates 31, and then n type layers 34 corresponding to well regions 14, and a source region 35A and a drain region 35B corresponding to emitter regions 15 were formed in a similar manner. Buffer layer 32, p type layer 33, n type layers 34, source region 35A, and drain region 35B are the same in impurity concentrations, thicknesses, and the like as the corresponding ones in the foregoing IGBTs. Formed in addition to these were a gate oxide film 37 corresponding to gate oxide film 17, ohmic contact electrodes 38 corresponding to ohmic contact electrodes 18, a gate electrode 39 corresponding to gate electrode 19, and a source electrode 41A and a drain electrode 41B corresponding to emitter electrodes 21. Here, referring to FIG. 7, a channel length L was set at 100 μm, and a channel width (the channel's width in a direction perpendicular to the plane of sheet in FIG. 7) was set at 150 μm.

Then, the TEG-MOSFETs of the example and the comparative example were operated to measure each channel mobility thereof.

Now, the results of experiment will be described. Table 1 shows the results of measurements of the channel mobilities and the on resistances. In addition, respective reverse breakdown voltages of the IGBTs of the example and the comparative example were measured. It was confirmed that each of the IGBTs had a sufficient reverse breakdown voltage of 10 kV or greater.

TABLE 1

| Substrate | | Mobility (cm$^2$/Vs) | On Resistance (mΩcm$^2$) |
|---|---|---|---|
| Comparative Example | 4H—SiC (0001) Substrate with 8° Off | 7 | 100 |
| Example | 4H—SiC (03-38) Substrate | 50 | 73 |

Referring to Table 1, it is appreciated that the example of the present invention achieved a channel mobility more than seven times as large as that of the comparative example that falls out of the scope of the present invention. Moreover, the on resistance of the example was restrained by approximately 30% as compared with that of the comparative example. From these results, it was confirmed that according to the IGBT of the present invention, there can be provided an IGBT allowing for reduced on resistance by improving channel mobility.

Example 2

The following describes an Example 2 of the present invention. An experiment was conducted to inspect a relation between the channel mobility and the maximum value (peak nitrogen concentration) of the nitrogen concentration in the region distant away by 10 nm or shorter from the interface between each well region and the oxide film. The experiment was conducted in the following procedure.

Figure 8:
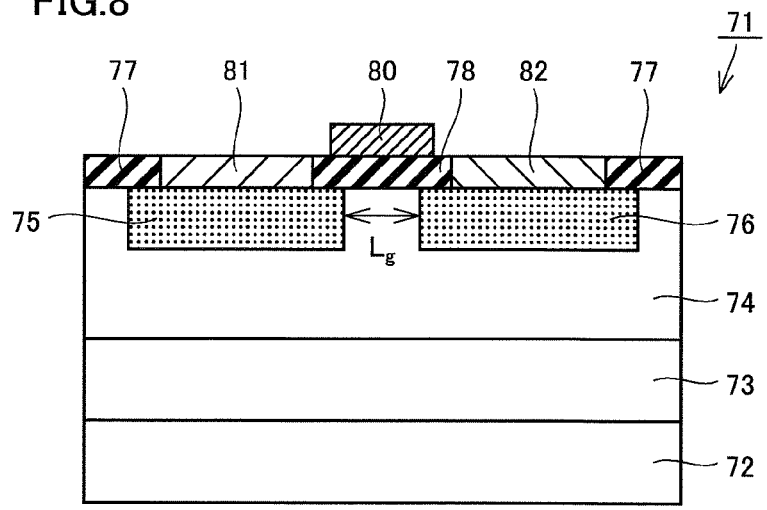
FIG. 8 is a schematic cross sectional view of a structure of a MOSFET of lateral type used as a sample in an experiment.

First, as each of samples, a MOSFET 71 of lateral type was fabricated as shown in FIG. 8. More specifically, on an n type silicon carbide substrate 72 having a thickness of 400 μm, an epitaxial layer 73 having a thickness of 10 μm was formed. Then, on epitaxial layer 73, a p type layer 74 having a thickness of 1 μm was formed. Then, into p type layer 74, phosphorus (P) was implanted as an n type impurity to form n⁺ regions 75, 76 each having an n type impurity concentration of $1\times10^{20}$ cm$^{-3}$. A distance between n⁺ regions 75, 76 corresponded to the gate length (channel length $L_g$), which was set at 100 μm. Further, the gate width (channel width) was set at 200 μm.

Then, dry oxidation treatment was provided to form an oxide film and thereafter nitrogen annealing was performed by heating in a NO gas atmosphere. In doing so, an amount of nitrogen introduced was changed by changing heating time. Thereafter, the oxide film was etched to form into shapes corresponding to oxide films 77, 78, and there were formed a source electrode 81, a drain electrode 82, and a gate electrode 80 on oxide film 78 serving as the gate oxide film. Each of source electrode 81 and drain electrode 82 was made of nickel (Ni), and had a thickness of 0.1 μm. Further, gate electrode 80 was made of aluminum (Al), and had a thickness of 1 μm. With the above-described procedure, MOSFET 71 of the lateral type was completed as a sample. In addition, for the purpose of comparison, another sample was fabricated with the nitrogen annealing not being performed in the procedure.

The following describes a method for measuring the channel mobility. With a source-drain voltage $V_{DS}$=0.1 V, a gate voltage $V_G$ was applied and source-drain current $I_{DS}$ was measured (gate voltage dependency was measured). Then, with $g_m=(\delta I_{DS})/(\delta V_G)$, the maximum value of the channel mobility relative to the gate voltage was determined from the following formula:

$$\text{channel mobility } \mu = g_m \times (L \times d)/(W \times \epsilon \times V_{DS}),$$

where L indicates the gate length, d indicates the thickness of the oxide film, W indicates the gate width, and ε indicates the permittivity of the oxide film.

Further, for each of the samples, distribution of the nitrogen concentration was measured in a depth direction in the vicinity of the interface between oxide film 78 and p type layer 74 (region distant away by 10 nm or shorter from the interface). The measurement was performed using a SIMS (secondary ion mass spectrometry).

Figure 9:
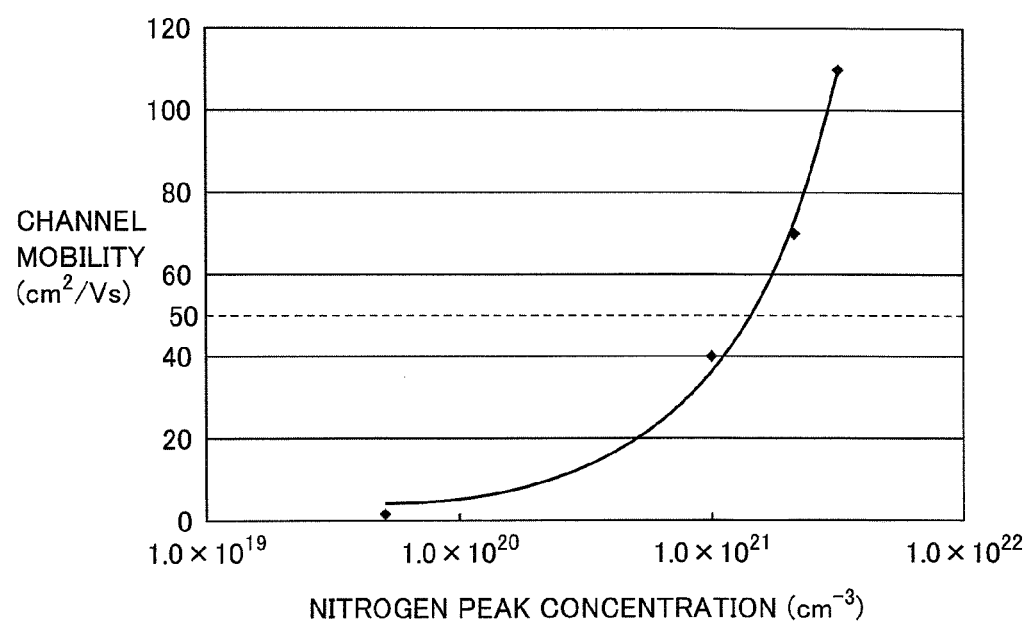
FIG. 9 shows a relation between a nitrogen peak concentration and channel mobility.

The following describes the results of experiment with reference to FIG. 9. In FIG. 9, the horizontal axis represents the peak value of nitrogen concentration (peak nitrogen concentration) measured in each of the samples. The vertical axis represents the measured channel mobility therein.

Referring to FIG. 9, as the peak nitrogen concentration became higher in the region distant away by 10 nm or shorter from the interface between oxide film 78 and p type layer 74, the channel mobility became higher.

Here, the channel mobility is preferably 50 cm²/Vs or greater to reduce the on resistance by an amount greater than that in the conventional IGBT employing silicon as its raw material. Hence, referring to FIG. 9, it can be said that in consideration of variations in the manufacturing process and the like, the nitrogen peak concentration is preferably set at $1\times10^{21}$ cm$^{-3}$ or greater. It should be noted that in the present example, the experiment was conducted using the n channel type MOSFETs, but also in p channel type MOSFETs, the channel mobility depends on the nitrogen peak concentration in a similar way. Hence, in order to sufficiently reduce the on resistance in the IGBT of the present invention, it can be said that the maximum value of the nitrogen concentration is preferably set at $1\times10^{21}$ cm$^{-3}$ or greater in the region distant away by 10 nm or shorter from the interface between each well region and the oxide film, irrespective of whether the channel is of n type or p type.

Example 3

The following describes an Example 3 of the present invention. An experiment was conducted to inspect a relation between the off angle of the substrate and the channel mobility. The experiment was conducted in the following procedure.

First, samples were fabricated using the same manufacturing method as the method for manufacturing the sample having the highest channel mobility in Example 2 described above. Specifically, substrates having main surfaces different in plane orientations were used to fabricate four types of samples as comparative examples and three types of samples as examples of the present invention. More specifically, as a comparative example A, a sample was prepared which used a silicon carbide substrate having a main surface with an off angle of 8° relative to the plane orientation of (0001) (substrate of 8° off relative to (0001)). As a comparative example B, a sample was prepared which used a substrate having a main surface with a plane orientation expressed by (01-15). As a comparative example C, a sample was prepared which used a substrate having a main surface with a plane orientation expressed by (01-14). As a comparative example D, a sample was prepared which used a substrate having a main surface with an off angle of 70° relative to the plane orientation of (0001). Meanwhile, the examples of the present invention were as follows. As an example A, a sample was prepared which used a substrate having a main surface with a plane orientation expressed by (01-13). As an example B, a sample was prepared which used a substrate having a main surface with a plane orientation expressed by (03-38). As an example C, a sample was prepared which used a substrate having a main surface with a plane orientation expressed by (01-12).

Then, channel mobility in each of the samples described above was measured. A method employed to measure the channel mobility was the same method as the method for measuring the channel mobility in Example 2 described above.

Figure 10:
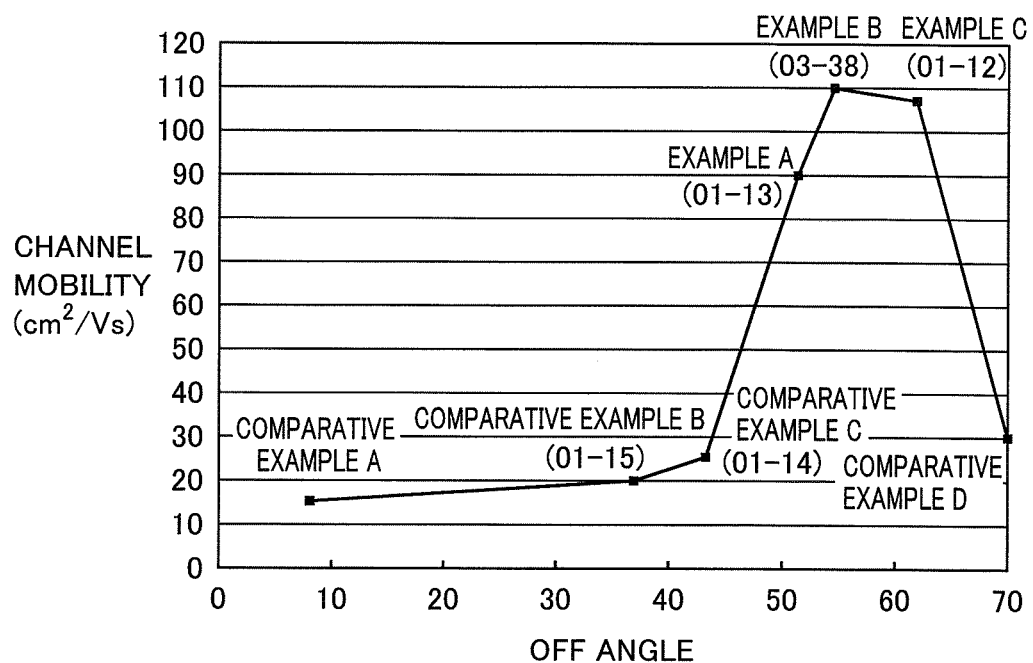
FIG. 10 shows a relation between an off angle of a main surface of a substrate relative to a plane orientation of {0001} and the channel mobility.

The following describes the results of experiment with reference to FIG. 10. Here, in FIG. 10, the horizontal axis represents the off angle of the main surface of the substrate of each sample relative to the plane orientation of {0001}. The vertical axis represents the channel mobility therein.

Referring to FIG. 10, regarding the samples of examples A-C with the off angles falling within the range corresponding to that of the examples of the present invention (not less than 50° and not more than 65°), it is appreciated that the values of channel mobilities were significantly improved as compared with those in the comparative examples. Here, in the present example, the experiment was conducted using the n channel type MOSFETs, but also in p channel type MOSFETs, the channel mobility depends on the off angle in a similar way. Hence, in order to sufficiently reduce the on resistance of the IGBT, it is effective to employ a substrate having a main surface with an off angle of not less than 50° and not more than 65° relative to the plane orientation of {0001}, irrespective of whether or not the channel is of n type or p type.

In the above-described examples, it has been described that the carrier mobility (channel mobility) is improved by adopting a main surface close to the (03-38) plane, as a result of the conducted experiment that utilizes the structure provided with the semiconductor layers and the insulating film formed on and above the main surface of the silicon plane side. Meanwhile, the inventor also has conducted an experiment using a structure provided with semiconductor layers and an insulating film formed on the main surface of the carbon plane side. The inventor has found that the carrier mobility (channel mobility) is further improved by adopting a main surface close to the (0-33-8) plane.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

INDUSTRIAL APPLICABILITY

An insulated gate bipolar transistor of the present invention is advantageously applicable to, in particular, an insulated gate bipolar transistor required to reduce the on resistance.

DESCRIPTION OF THE REFERENCE SIGNS

1: IGBT; 3: TEG-MOSFET; 11: substrate; 11A: main surface; 12: buffer layer; 13: reverse breakdown voltage holding layer; 13A: first main surface; 13B: second main surface; 14: well region; 14A: channel region; 15: emitter region; 16: contact region; 17: gate oxide film; 17A: thermal oxidation film; 18: ohmic contact electrode; 19: gate electrode; 20: collector electrode; 21: emitter electrode; 22: high-concentration nitrogen region; 31: substrate; 32: buffer layer; 33: p type layer; 34: n type layer; 35A: source region; 35B: drain region; 37 gate oxide film; 38: ohmic contact electrode; 39: gate electrode; 41A: source electrode; 41B: drain electrode; 71: MOSFET; 72: n type silicon carbide substrate; 73: epitaxial layer; 74: p type layer; 75, 76: n$^+$ region; 77, 78: oxide film; 80: gate electrode; 81: source electrode; 82: drain electrode.

The invention claimed is:

1. An insulated gate bipolar transistor, comprising:
    a substrate of first conductive type, said substrate being made of silicon carbide and having a main surface with an off angle of not less than 50° and not more than 65° relative to a plane orientation of {0001};
    a reverse breakdown voltage holding layer of second conductive type different from said first conductive type, said reverse breakdown voltage holding layer being made of silicon carbide and formed on said main surface of said substrate;
    a well region of said first conductive type, said well region being formed in said reverse breakdown voltage holding layer so as to include a second main surface thereof, said second main surface being a main surface opposite to a first main surface thereof adjacent to said substrate;
    an emitter region formed in said well region to include said second main surface and including an impurity of said second conductive type at a concentration higher than that of said reverse breakdown voltage holding layer;
    an oxide film made of oxide and formed on said reverse breakdown voltage holding layer in contact with said second main surface; and
    an electrode formed on said oxide film,
    in a region including an interface between said well region and said oxide film, a high-concentration nitrogen region being formed to have a nitrogen concentration higher than those of said well region and said oxide film,
    wherein a nitrogen concentration in a region distant away from 10 nm or shorter from said interface between said well region and said oxide film has a maximum value of not less than $1 \times 10^{21}$ cm$^{-3}$.

2. The insulated gate bipolar transistor according to claim 1, wherein said main surface of said substrate has an off orientation falling within a range of ±5° or smaller relative to a <11-20> direction.

3. The insulated gate bipolar transistor according to claim 1, wherein said main surface of said substrate has an off orientation falling within a range of ±5° or smaller relative to a <01-10> direction.

4. The insulated gate bipolar transistor according to claim 3, wherein said main surface of said substrate has a plane orientation with an off angle of not less than −3° and not more than +5° relative to a plane orientation of {03-38}.

5. The insulated gate bipolar transistor according to claim 3, wherein said main surface of said substrate has an off angle of not less than −3° and not more than +5° relative to a (0-33-8) plane in the <01-10> direction.

* * * * *